United States Patent
Blom

(10) Patent No.: US 7,088,139 B1
(45) Date of Patent: Aug. 8, 2006

(54) LOW POWER TRI-LEVEL DECODER CIRCUIT

(75) Inventor: Eric David Blom, Wakefield, MA (US)

(73) Assignee: National Semiconductor Corporation, Santa Clara, CA (US)

( * ) Notice: Subject to any disclaimer, the term of this patent is extended or adjusted under 35 U.S.C. 154(b) by 119 days.

(21) Appl. No.: 10/750,375

(22) Filed: Dec. 31, 2003

(51) Int. Cl.
H03K 17/693 (2006.01)
H03K 19/094 (2006.01)

(52) U.S. Cl. .................. 326/60; 326/106; 327/416

(58) Field of Classification Search .......... 326/57, 326/105–108, 59, 60; 327/415, 416
See application file for complete search history.

(56) References Cited

U.S. PATENT DOCUMENTS

| 5,457,411 | A | 10/1995 | Hastings |
| 5,610,537 | A | 3/1997 | Hastings |
| 6,201,378 | B1 * | 3/2001 | Eto et al. ............... 323/313 |
| 6,472,907 | B1 * | 10/2002 | Setogawa ............... 326/83 |
| 6,700,416 | B1 * | 3/2004 | Cowles .................. 327/74 |
| 6,864,725 | B1 * | 3/2005 | Cowles et al. .......... 327/108 |

* cited by examiner

Primary Examiner—Daniel Chang
(74) Attorney, Agent, or Firm—Darby & Darby PC; Matthew M. Gaffney

(57) ABSTRACT

A tri-level decoder circuit includes a first decoder circuit and a second decoder circuit. The first decoder circuit is configured to compare an input voltage to a first threshold, and the second decoder circuit is configured to compare the input voltage to a second threshold. The first decoder circuit is configured to provide substantially no current to a current mirror if the input voltage is less than the first threshold, and to provide a current to the current mirror otherwise. The current mirror is configured to reflect the current to provide a reflected current. A current source is configured to pull down a first output node to a first logic level if the reflected current is substantially zero. The current mirror is configured to drive the first output node to a second logic level otherwise. The second decoder circuit may operate similarly.

23 Claims, 6 Drawing Sheets

LOW POWER TRI-LEVEL DECODER CIRCUIT

FIELD OF THE INVENTION

The invention is related to decoding, and, in particular, to an apparatus for tri-level decoding that uses a current mirror in the determination of each digital output signal.

BACKGROUND OF THE INVENTION

Tri-level decoders are typically used to detect conditions at the input pins of an integrated circuit. For example, tri-level decoders are used to detect if an integrated circuit pin has been shorted to the power supply, shorted to ground, or driven to an intermediate voltage level. This application of tri-level logic is useful to help minimize the number of die bonding pads and package pins required on an integrated circuit. If binary logic was used, two pins would be required to decode three states. Tri-level logic can detect three states using only one die pad and one package pin. Similarly, two tri-level logic signals can decode nine states using two pins, can while binary logic would require four pins.

BRIEF DESCRIPTION OF THE DRAWINGS

Non-limiting and non-exhaustive embodiments of the present invention are described with reference to the following drawings, in which.

DETAILED DESCRIPTION

Figure 1:
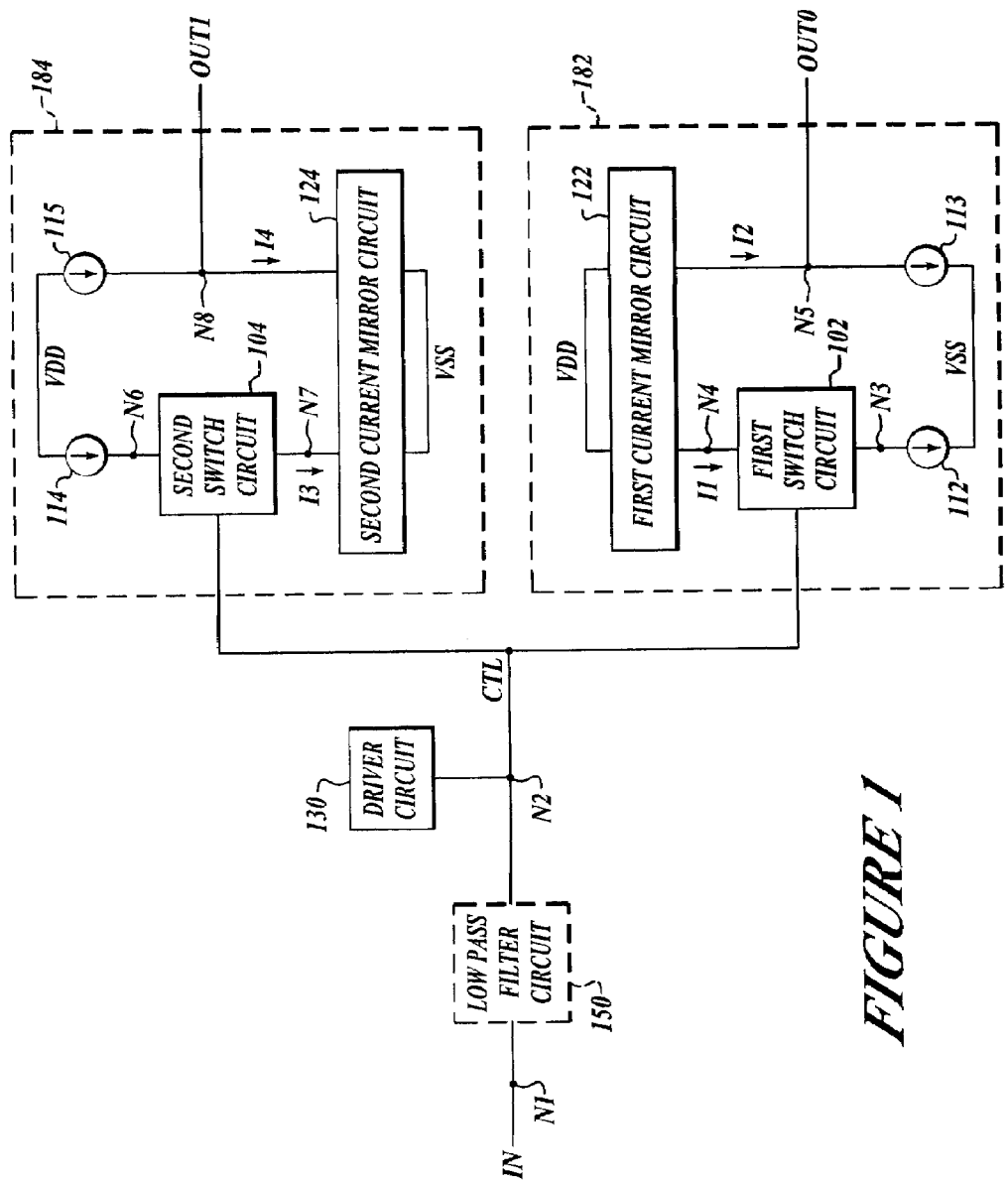
FIG. 1 illustrates a block diagram of a tri-level decoder circuit.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for the terms. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected, or an indirect connection through one or more passive or active intermediary devices. The term "circuit" means either a single component or a multiplicity of components, either active and/or passive, that are coupled together to provide a desired function. The term "signal" means at least one current, voltage, charge, temperature, data, or other signal.

Briefly stated, the invention is related to implementing a tri-level decoder circuit. The tri-level decoder circuit includes a first decoder circuit and a second decoder circuit. The first decoder circuit is configured to compare an input voltage to a first threshold associated with the lower rail of the power supply, and the second decoder circuit is configured to compare the input voltage to a second threshold associated with the upper rail of the power supply.

The first decoder circuit is configured to provide substantially no current to a current mirror if the input voltage is less than the first threshold, and to provide a current to the current mirror otherwise. Also, the current mirror is configured to reflect the current to provide a reflected current. A current source is configured to pull down a first output node to a first logic level if the reflected current is substantially zero. The current mirror is configured to drive the first output node to a second logic level otherwise. Additionally, the second decoder circuit operates in a substantially similar manner to the first decoder circuit, albeit different in some ways.

FIG. 1 illustrates a block diagram of a tri-level decoder circuit (100). Tri-level decoder circuit 100 includes a first decoder circuit (182), a second decoder circuit (184), a driver circuit (130), and low-pass filter circuit 150. Decoder circuit 182 includes a first switch circuit (102), a first current source (112), a first current mirror circuit (122), and a second current source circuit (113). Decoder circuit 184 includes a second switch circuit (104), a third current source (114), a second current mirror circuit (124), and a fourth current source circuit (115). Current source circuits 112–115 may each include a transistor, a resistor, or the like.

First switch circuit 102 is coupled to a first switch node (N3), a first mirror node (N4), and a control node (N2). Current source circuit 112 is coupled to node N3. Current mirror circuit 122 has a first port coupled to node N4 and a second port coupled to a first output node (N5). Current source circuit 113 is coupled to node N5.

Second switch circuit 104 is coupled to a second switch node (N6), a second mirror node (N7), and node N2. Current source circuit 114 is coupled to node N6. Current mirror circuit 124 has a first port that is coupled to node N7 and a second port that is coupled to a second output node (N8). Current source circuit 115 is coupled to node N8. Low-pass filter circuit 150 is coupled between nodes N1 and N2. Low-pass filter circuit 150 is an optional element that need not be included in circuit 100. Driver circuit 130 is coupled to node N2.

First switch circuit 102 is configured to receive a control signal (CTL) at node N2. The control signal has an associated voltage (VCTL). Switch circuit 102 is further configured to reduce a resistance between node N4 and node N3 if voltage VCTL exceeds a low threshold. Switch circuit 102 is further configured to isolate node N4 from node N3 otherwise.

Current mirror circuit 122 is configured to receive a first switch current (I1) at node N4. Current mirror circuit 122 is further configured to reflect current 11 to provide a first reflected current (I2) at node N5 according to a pre-determined ratio (A). Preferably, the ratio (A) is greater than one-to-one. According to one example, the ratio (A) is three-to-one such that I2 is approximately three times greater than I1.

Switch circuit 104 is configured to also receive voltage VCTL. Switch circuit 104 is further configured to isolate node N7 from node N6 if voltage VCTL exceeds a high threshold. Switch circuit 104 is further configured to reduce a resistance between node N6 and node N7 otherwise.

Current mirror circuit 124 is configured to receive a second switch current (I3) at node N7. Current mirror circuit 124 is further configured to reflect current I3 to provide a second reflected current (I4) at node N8 according to another pre-determined ratio (B). According to one example, B is the same as the pre-determined ratio (A). Alternatively, the ratio (A) may be different from the other ratio (B).

Driver circuit 130 is configured such that if node N2 does not receive an input signal strong enough to drive node N2, driver circuit 130 actively drives node N2 so that node N2 is not floating. Driver circuit 130 is configured to drive node N2 to a voltage between the low threshold and the high threshold if node N2 does not receive a driving input signal. Node N2 will receive a driving input signal from node N1 if node N1 is driven to an active high logic level or an active low logic level. Node N2 will not receive a driving input signal if node N1 is left floating.

Circuit 100 receives an input signal (IN) at node N1. Signal IN has an associated voltage (VIN). According to one implementation, circuit 100 is configured to detect whether node N1 has been actively pulled high, actively pulled low, or left floating, and to produce a corresponding two-bit digital output, with one bit each at nodes N5 and N8. According to an alternative implementation, circuit 100 is configured to detection with node N1 is actively pulled high, actively pulled low, or driven to an intermediate voltage level. Circuit 100 is arranged to provide signal OUT0 at node N5 and signal OUT1 at node N8. Signal OUT0 has a corresponding voltage (VOUT0), and signal OUT1 has another corresponding voltage (VOUT1). Signal OUT0 corresponds to a logic low if node N1 actively driven low. Signal OUT0 corresponds to a logic high if node N1 is either floating or actively driven high. Signal OUT1 corresponds to a logic low if node N1 is either floating or actively driven low. Signal OUT1 corresponds to a logic high if node N1 is actively driven high. Signal OUT0 corresponds to one bit of the two-bit digital output, and signal OUT1 corresponds to another bit of the two-bit digital output. These values are summarized in the truth table below. According to the alternative implementation, "floating" may be replaced with "intermediate voltage level."

| VIN | OUT1 | OUT0 |
|---|---|---|
| 0 | 0 | 0 |
| floating | 0 | 1 |
| 1 | 1 | 1 |

The decoded digital output bits at node N5 and N8 can be latched. If the decoded digital output bits are latched, driver circuit 130, decoder circuit 182, and decoder circuit 184 can then all be switched off to reduce power consumption.

In one example, circuit 100 is configured to operate over a wide power supply range, to operate with relatively little power, and can be implemented in a relatively small area for an integrated circuit.

According to one embodiment, driver circuit 130 is configured to drive node N2 (and thus node N1 also) such that circuit 100 requires no external passive or active circuit components. According to another embodiment, circuit 100 does not include driver circuit 130.

In the embodiment where circuit 100 includes driver circuit 130, driver circuit 130 is configured to generate an intermediate voltage level. In this embodiment, circuit 100 is configured to detect if node N1 has been shorted to the power supply, shorted to ground, or externally left "floating". If node N1 is not actively driven, the internal driver maintains node N1 at the intermediate voltage level and an external circuit to drive the pin to that level is not required.

Driver circuit 130 is not necessary for decoder functionality. In the embodiment where driver circuit 130 is not included in circuit 100, circuit 100 is configured to detect whether node N1 is tied to ground, tied to power, or driven to an intermediate voltage level. An external driver (not shown) may be used to drive the node to the intermediate voltage level if node N1 is not tied to power or ground.

Figure 2:
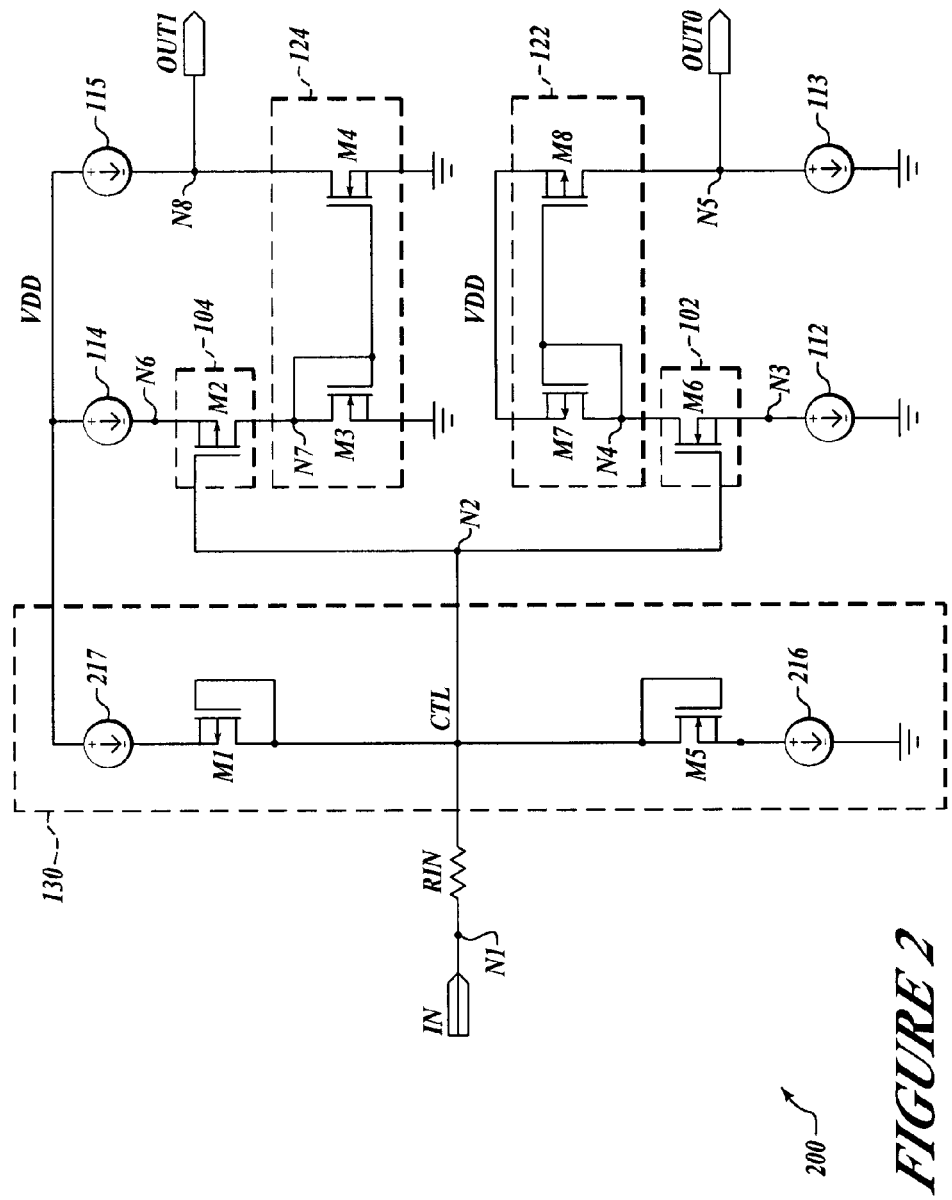
FIG. 2 schematically illustrates an exemplary embodiment of the tri-level decoder circuit of FIG. 1.

FIG. 2 schematically illustrates an exemplary embodiment (200) of circuit 100. In this implementation, driver circuit 130 includes transistors (M1 and M5) and current sources (216 and 217). Transistors M1 and M5 are each configured to operate as a diode. Switch circuit 102 includes transistor M6. Switch circuit 104 includes transistor M2. Current mirror circuit 122 includes transistors M7 and M8. Current mirror circuit 124 includes transistors M3 and M4. Circuit 200 may optionally further include a resistor (Rin).

According to this implementation, the low threshold corresponds to: the threshold voltage of transistor M6, plus the saturation voltage of current source circuit 112, minus the voltage drop across resistor Rin. The high threshold corresponds to: Vdd minus the threshold of transistor M2, plus the voltage drop across resistor Rin, where Vdd is the voltage associated with the power supply.

Figure 3:
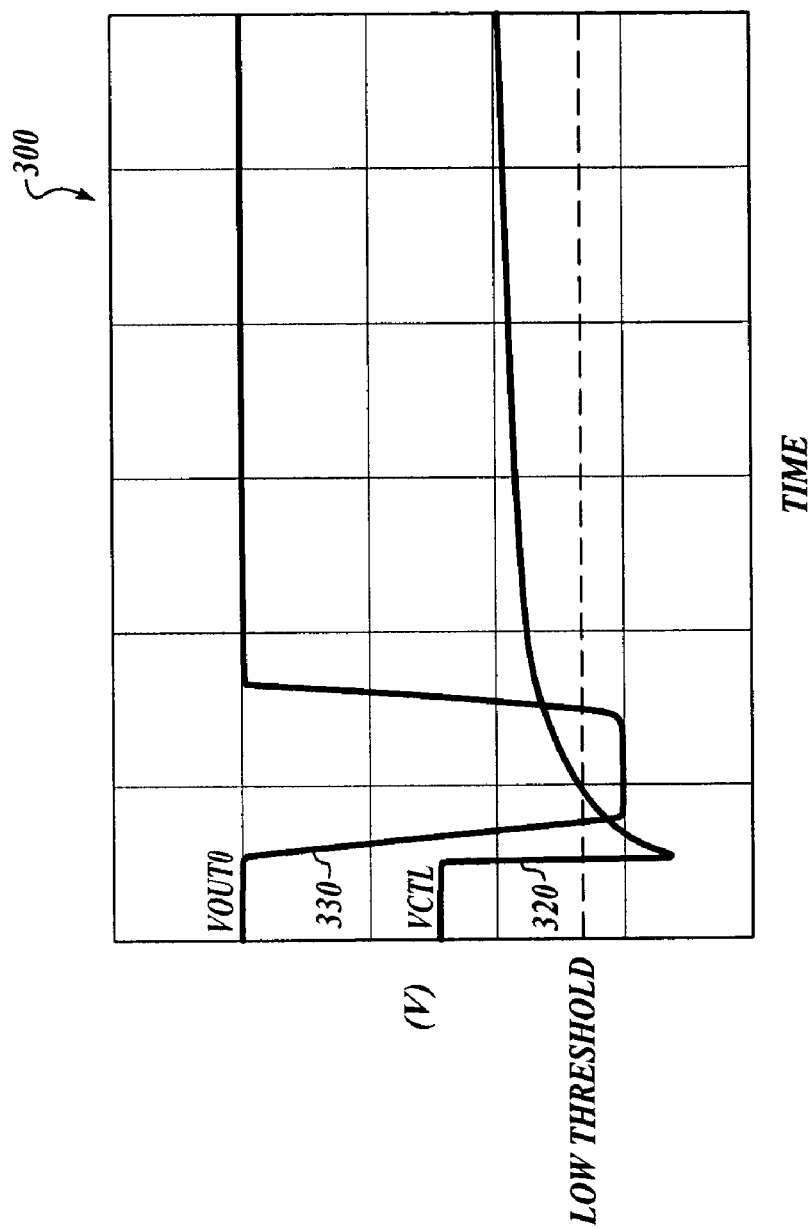
FIG. 3 illustrates a timing diagram of waveforms of the tri-level decoder circuit of FIG. 2.

FIG. 3 illustrates a timing diagram (300) for circuit 200. Timing diagram 300 includes a waveform for VCTL (320) and a waveform for VOUT0 (330). Timing diagram 300 shows VCTL and VOUT0 when voltage VCTL undergoes a relatively large negative glitch, coupled through an external capacitance. Timing diagram 300 shows a negative glitch in voltage VCTL before voltage VCTL recovers from the glitch. In one embodiment, if node N1 is externally floated, then it is being driven only by the relatively weak, low power internal driver. It is then possible for noise or fast slewing signals to be capacitively coupled into node N1, for example, through parasitic capacitance between electronic circuit traces such those found in printed circuit boards, integrated circuits, and the like. If a relatively large negative glitch occurs in voltage VCTL, transistor M6 conducts substantially no current. If that happens, digital output voltage VOUT0 is pulled to a logical low by current source circuit 113, as shown in timing diagram 300. Accordingly, this negative glitch can result in a false reading in the digital output signal.

Figure 4:
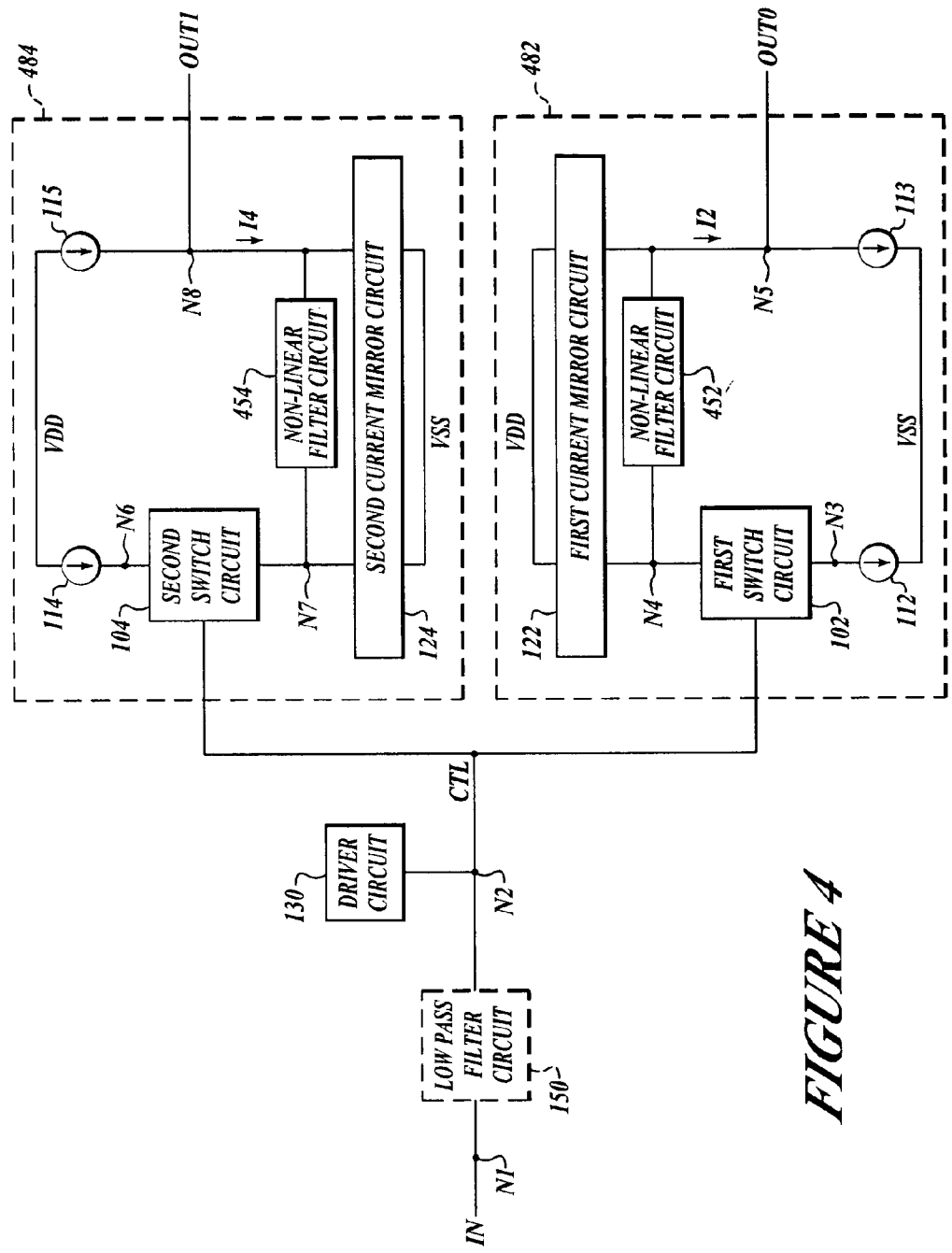
FIG. 4 shows a block diagram of another tri-level decoder circuit.

FIG. 4 shows a block diagram of another tri-level decoder circuit (400). Circuit 400 is substantially similar to circuit 100 in some ways, albeit different in other ways. Tri-level decoder circuit 100 includes a first decoder circuit (482), a second decoder circuit (484), a driver circuit (130), and a low-pass filter circuit (440). First decoder circuit 482 is similar to first decoder circuit 182 in some ways, albeit different in other ways. Decoder circuit 482 further includes a non-linear filter circuit (452) that is coupled between nodes N4 and N5.

Second decoder circuit 484 is similar to second decoder circuit 184 in some ways, albeit different in other ways. Decoder circuit 484 further includes another non-linear filter circuit (454) that is coupled between nodes N7 and N8.

Low-pass filter circuit 150 is coupled between nodes N1 and N2. Non-linear filter circuit 452 is configured for preventing negative glitches from giving a false reading for signal OUT0. Non-linear filter circuit 454 is configured for preventing positive glitches from giving a false reading for signal OUT1.

Figure 5:
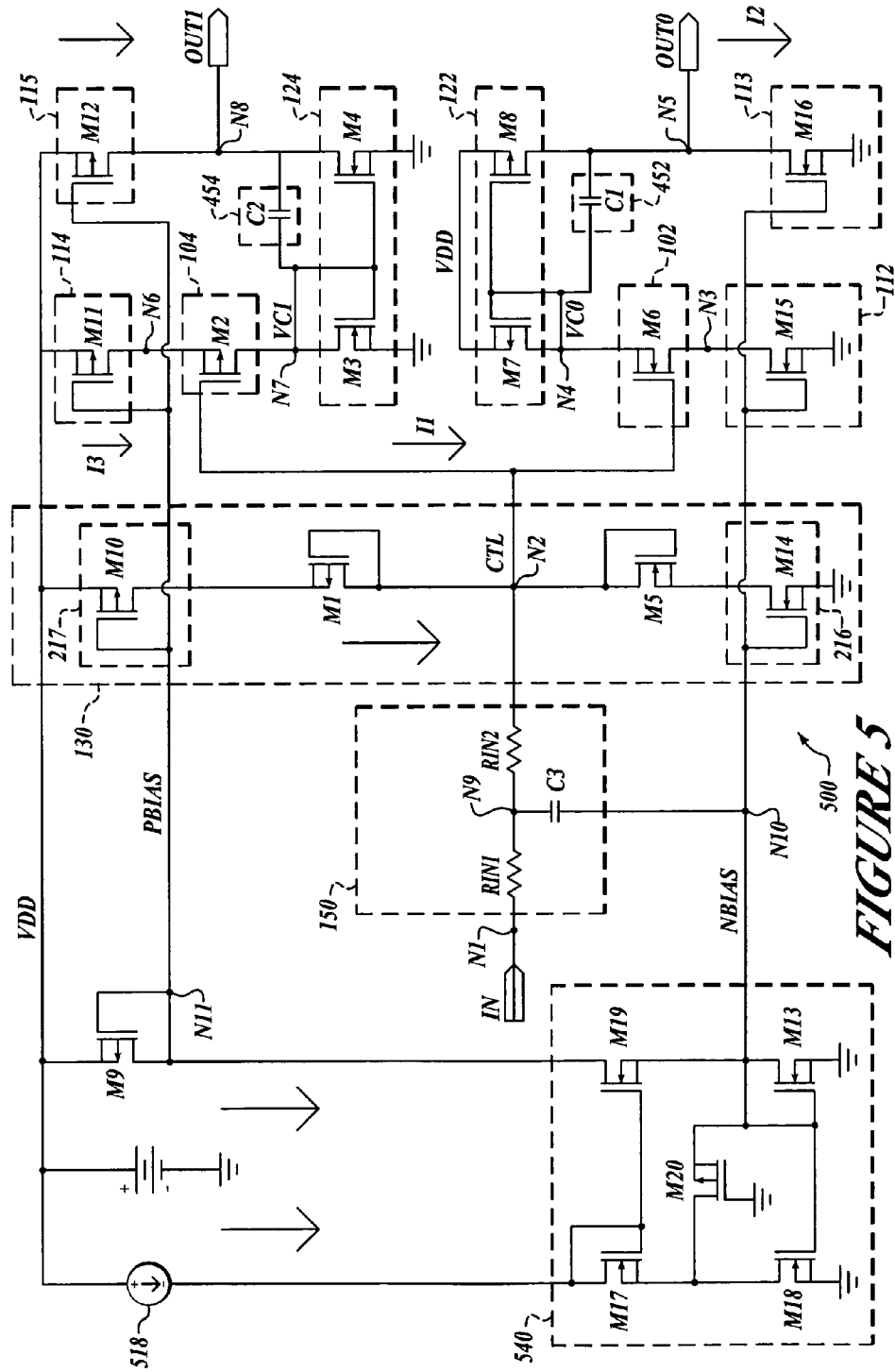
FIG. 5 schematically illustrates an exemplary implementation of the tri-level decoder circuit of FIG. 4 that includes additional components.

FIG. 5 schematically illustrates a tri-level decoder circuit (500) that is an exemplary implementation of circuit 400. Circuit 500 is substantially similar to circuit 400 in some ways, albeit different in other ways.

Circuit 500 further includes a modified Wilson current mirror circuit (540), low-pass filter circuit 150, transistor M9 and current source 518. Current source circuit 112 includes transistor M15. Current source circuit 113 includes transistor M16. Current source circuit 114 includes transistor M11. Current source circuit 115 includes transistor M12. Current source 216 includes transistor M14. Current source 217 includes transistor M10. Non-linear filter circuit 452 includes capacitor C1. Non-linear filter circuit 454 includes capacitor C2. Modified Wilson current mirror circuit 540 includes transistors M13 and M17–M20. Low-pass filter circuit 150 includes two resistors (Rin1 and Rin2) and capacitor C3. Resistor Rin1 is coupled between nodes N1 and N9. Resistor Rin2 is coupled between nodes N2 and N9. Capacitor C3 is coupled between nodes N9 and N10. The gates of transistors M14–M16 are all coupled to node N10. The gates of transistors M9–M12 are all coupled to node N11.

Capacitor C1 is configured to operate as a drooping sample-and-hold circuit if transistor M6 is deactivated as a result of a capacitively coupled glitch. If a relatively large negative transient glitch is applied at node N2, transistor M6 conducts substantially no current.

Transistors M10–M12 are each configured to receive a p-type bias signal (pbias) at their respective gates. Transistors M14–M16 are each configured to receive an n-type bias signal (nbias) at their respective gates.

When excited by extremely fast input edges, low-pass filter circuit 150 functions as a negative feedback loop. Capacitor C3 is arranged such that the voltage at node N10 is changed if the voltage at node N9 changes. Driver circuit 130 is configured to pull the voltage in the opposite direction, providing negative feedback accordingly.

To maximize noise immunity, modified Wilson current mirror circuit 540 is configured to force the voltage at node N2 to a voltage near the midpoint between the low threshold and the high threshold if node N1 is floating. Transistor M20 is not used in the mirroring of the current. Transistor M20 is configured to function briefly as a current path from M17 to M13 to insure correct initial conditions when power is initially applied.

According to a low-power implementation of circuit 500, relatively little current is used to drive node N1 to the intermediate voltage level. If large amounts of drive current or large values of decoupling capacitance are not used, the intermediate voltage level may be susceptible to noise interference, typically in the form of signals capacitively coupled to node N1 through parasitic capacitance from nearby printed circuit board traces. Such interfering signals could instantaneously corrupt signal IN enough such that the decoder, if evaluated at that instant, would decode an erroneous level at the input.

Large values of decoupling capacitance may not be economical within an integrated circuit and may be a cost and area disadvantage if required externally on the printed circuit board. The low-power implementation is configured to reject interfering signals without requiring the use of large drive currents or of large internal or external capacitors. A relatively small internal capacitor (less than 0.5 pF) can be used to set a low-pass-filtering maximum slew rate during normal mid-level decoding. The same small capacitor is configured to cause each decoder circuit to act as a drooping sample and hold when short-time interfering signals of large amplitude are present during decoding. As will be shown, the maximum slew rate for non-interfering signals is many times faster than the slow droop rate. Thus, in the low-power implementation of the circuit 500, each of the decoder circuits is configured to attenuate both low level wideband interfering signals and short-time large level interfering signals, such as capacitively coupled voltage steps, by functioning as a non-linear low-pass filter. This interference rejection is equivalent to the rejection of circuits using much more drive current or to circuits using much larger capacitors.

Figure 6:
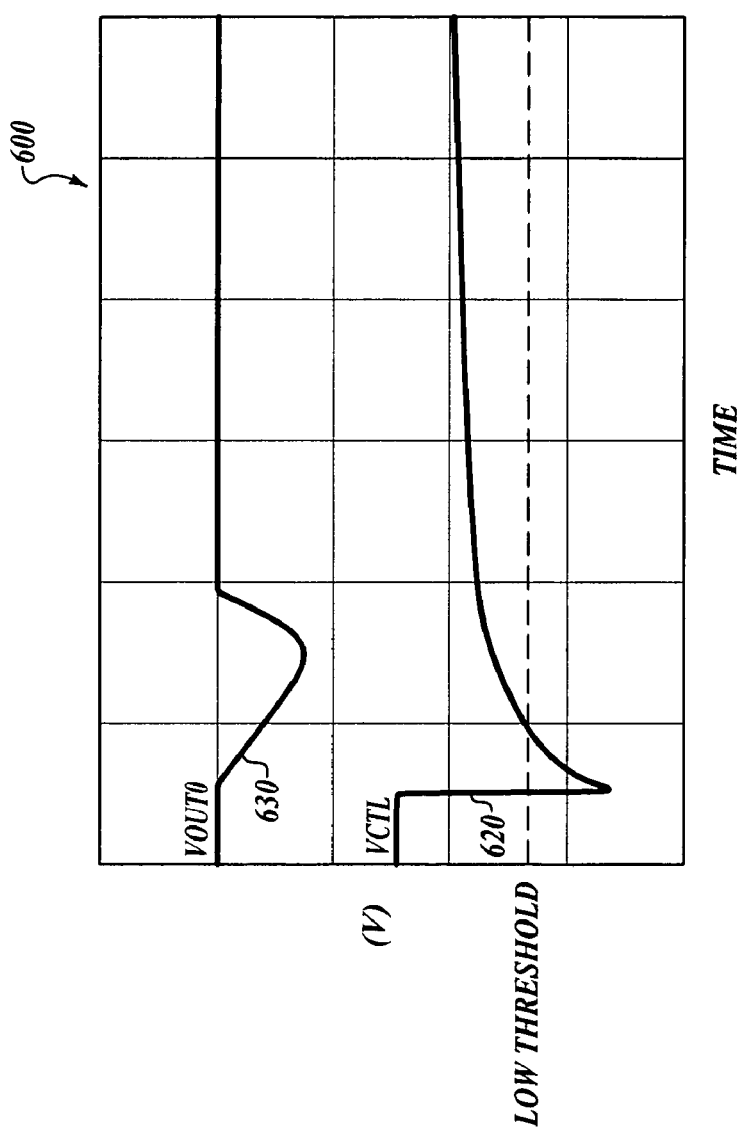
FIG. 6 shows a timing diagram of waveforms of the tri-level decoder circuit of FIG. 5, in accordance with aspects of the present invention.

FIG. 6 shows a timing diagram (600) for circuit 500. Timing diagram 600 includes a waveform for VCTL (620) and a waveform for VOUT0 (630). Timing diagram 600 shows voltages VCTL and VOUT0 when voltage VCTL a negative glitch. Timing diagram 600 shows a negative glitch in voltage VCTL before voltage VCTL recovers from the glitch. As can be seen, voltage VOUT0 is affected, but does not go low enough to result in a false reading.

Timing diagram 600 illustrates a relatively large negative transient glitch capacitively coupled into node N1. If a negative glitch occurs in voltage VCTL, transistor M6 conducts substantially no current. If this event occurs, decoder circuit 482 functions as a drooping sample/hold amplifier with a known discharge rate at the output (OUT0). Glitches that do not last long enough to slew down below the output digital logic threshold voltage do not cause a false digital output. The rate of drooping is approximately given by I2/[C1*(A+1)]. Positive transient glitches do not cause a false output at node N5.

In one embodiment, the slew rate at VOUT0 is many times faster for positive edges passing through its switching transition level than for negative edges. This is because M6 is turned on under these conditions and thus there exist two current paths, that through M6 and that through M8, to supply charging current to the capacitor C1. If the capacitance seen at the gates of M7 and M8 were very small, the total instantaneous current available to charge C1 would be given by Icharge=[I1*(A+1)]−I(M16). However, for small values of C1, the gate capacitances at M7 and M8 sum to a number comparable to the value of C1, and the instantaneous current charging C1 is limited to a smaller multiple due to current division which occurs when simultaneously charging C1 and the gate capacitances. In one embodiment in a CMOS process, with A=3 and C1=0.25 pF, the positive transition slew rate is approximately five times faster than the negative transition slew rate.

As shown in FIG. 5, capacitor C2 is configured to operate in a substantially analogous manner to capacitor C1. Capacitor C2 is configured to act as a drooping sample-and-hold circuit if large positive transient glitches are applied in voltage VCTL, where here the droop is a positive voltage change, toward the erroneous logic high state at VOUT1. The rate of drooping is approximately given by I4/[C2*(B+1)]. Negative transient glitches do not cause a false output at node N8. The output slew rate for negative edges passing through its transition level is similarly many times faster than the droop rate while holding.

Capacitors C1 and C2 are both configured to operate as non-linear slew rate-limiting filters. Capacitors C1 and C2 are configured to hold the old correct digital value and slowly slew towards an erroneous output level if large amplitude transient glitches, which would otherwise cause false digital outputs, are applied.

The filtering provided by capacitors C1 and C2 may be provided by relatively small capacitors. According to one example, the capacitance of capacitors C1 and C2 are each well below 0.5 pf.

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A tri-level decoder circuit comprising:
   a first decoder circuit that is coupled between an input node and a first output node, wherein the first decoder circuit includes:
      a first switch circuit that is coupled to the input node;
      a current source circuit coupled to the first output node; and
      a first current mirror circuit that is coupled between the first switch circuit and the first output node; and
   a second decoder circuit that is coupled between the input node and a second output node, wherein
   the second decoder circuit includes:
      a second switch circuit coupled to the input node;
      a second current source circuit coupled to the second switch circuit; and
      a second current mirror circuit coupled between the second switch circuit and the second output node.

2. The tri-level decoder circuit of claim 1, wherein the first decoder circuit further includes another current source circuit coupled to the first switch circuit.

3. The tri-level decoder circuit of claim 2,
   wherein the first decoder circuit further comprises:
      a first current branch including the other current source circuit and the first switch circuit; and
      a second current branch including the current source circuit and the output node, and
   wherein the first current mirror circuit includes at least one component in each of the first and second current branches.

4. A tri-level decoder circuit comprising:
   a first decoder circuit that is coupled between an input node and a first output node, wherein the first decoder circuit includes:
      a first switch circuit that is coupled to the input node; and
      a first current mirror circuit that is coupled between the first switch circuit and the first output node; and
   a second decoder circuit that is coupled between the input node and a second output node, wherein the second decoder circuit is separate from the first decoder circuit, and wherein the first current mirror circuit is configured to:
      receive a first switch current from the first switch circuit; and
      reflect the first switch current to provide a first reflected current at the first output node in accordance with a ratio that is greater than one-to-one.

5. The tri-level decoder circuit of claim 4, wherein the second decoder circuit includes:
   a second switch circuit coupled to the input node;
   a second current source circuit coupled to the second switch circuit; and
   a second current mirror circuit coupled between the second switch circuit and the second output node.

6. A tri-level decoder circuit comprising:
   a first decoder circuit that is coupled between an input node and a first output node, wherein the first decoder circuit includes:
      a first switch circuit that is coupled to the input node; and
      a first current mirror circuit that is coupled between the first switch circuit and the first output node, wherein the first current mirror includes a plurality of p-type transistors; and
   a second decoder circuit that is coupled between the input node and a second output node,
   wherein the second decoder circuit includes a second current mirror circuit, the second current mirror circuit includes a plurality of n-type transistors, the first decoder circuit further includes a first current source circuit coupled to the first switch circuit, the first current source circuit and the first current mirror circuit are separate circuit elements, and
   wherein the first switch circuit is configured to:
      if a control voltage exceeds a low threshold
         reduce a resistance between a first port of the first current mirror circuit and the first current source circuit; else
         isolate the first port of the first current mirror circuit from the first current source circuit.

7. The tri-level decoder circuit of claim 6, wherein the first current source circuit comprises at least one of a transistor or a resistor.

8. A tri-level decoder circuit comprising:
   a first decoder circuit that is coupled between an input node and a first output node, wherein the first decoder circuit includes:
      a first switch circuit that is coupled to the input node;
      a current source circuit coupled to the first output node; and
      a first current mirror circuit that is coupled between the first switch circuit and the first output node; and
   a second decoder circuit that is coupled between the input node and a second output node; and
   a driver circuit that is coupled to a control node associated with the input node,
   wherein the driver circuit is configured such that
      if the input node does not receive a driving input signal, the driver circuit actively drives the control node.

9. The tri-level decoder circuit of claim 8, wherein the driver circuit comprises two current sources and two transistors, wherein each of the two transistors is configured to operate as a diode.

10. The tri-level decoder circuit of claim 8, further comprising:
    a low-pass filter circuit that is coupled between the control node and the input node.

11. A tri-level decoder circuit comprising:
    a first decoder circuit that is coupled between an input node and a first output node, wherein the first decoder circuit includes:
       a first switch circuit that is coupled to the input node; and
       a first current mirror circuit that is coupled between the first switch circuit and the first output node;
    a second decoder circuit that is coupled between the input node and a second output node;
    a driver circuit that is coupled to a control node associated with the input node, wherein the driver circuit is configured such that if the input node does not receive a driving input signal, the driver circuit actively drives the control node; and a low-pass filter circuit that is coupled between the control node and the input node, wherein the low-pass filter circuit comprises:

a resistor that is coupled to the driver circuit;

a capacitor that is coupled between the resistor and a first bias node, wherein the first decoder circuit further includes a first current source circuit coupled to the first switch circuit and the first bias node; and another resistor that is coupled between the input node and the resistor.

12. A tri-level decoder circuit comprising:
a first decoder circuit that is coupled between an input node and a first output node, wherein the first decoder circuit includes:
a first switch circuit that is coupled to the input node; and
a first current mirror circuit that is coupled between the first switch circuit and the first output node;
a second decoder circuit that is coupled between the input node and a second output node, wherein the second decoder circuit includes:
a second switch circuit coupled to the input node;
a second current source circuit coupled to the second switch circuit; and
a second current mirror circuit coupled between the second switch circuit and the second output node; and
a capacitor that is coupled between the second output node and another node between the second current mirror and the second switch circuit.

13. A tri-level decoder circuit comprising:
a first decoder circuit that is coupled between an input node and a first output node, wherein the first decoder circuit includes:
a first switch circuit that is coupled to the input node;
a current source circuit coupled to the first output node; and
a first current mirror circuit that is coupled between the first switch circuit and the first output node; and
a second decoder circuit that is coupled between the input node and a second output node, wherein
the first decoder circuit further comprises a non-linear filter circuit.

14. The tri-level decoder circuit of claim 13, wherein the non-linear filter circuit comprises a capacitor.

15. A tri-level decoder circuit, comprising:
a first decoder circuit that is coupled between an input node and a first output node, wherein the first decoder circuit includes:
a first switch circuit that is coupled to the input node; and
a first current mirror circuit that is coupled between the first switch circuit and the first output node;
a second decoder circuit that is coupled between the input node and a second output node,
wherein the first decoder circuit further comprises a non-linear filter circuit;
the non-linear filter circuit comprises a capacitor; and
wherein the first decoder circuit further comprises a non-linear filter circuit, wherein
the capacitor is coupled between the first output node and another node between the first switch circuit and the first current mirror circuit.

16. A tri-level decoder circuit comprising:
a first decoder circuit that is coupled between an input node and a first output node, wherein the first decoder circuit includes:
a first switch circuit that is coupled to the input node; and
a first current mirror circuit that is coupled between the first switch circuit and the first output node; and
a second decoder circuit that is coupled between the input node and a second output node,
wherein the first decoder circuit further includes a non-linear filter circuit;
the non-linear filter circuit includes a capacitor; and
wherein the capacitor has a capacitance that is less than 0.5 picofarads.

17. A tri-level decoder circuit, comprising:
a first switch circuit that is coupled to a first switch node, a first mirror node, and a control node, wherein
the first switch circuit is configured to:
receive a control voltage at the control node;
if the control voltage exceeds a low threshold
reduce a resistance between the first mirror node and the first switch node; else
isolate the first mirror node from the first switch node;
a first current source circuit that is coupled to the first switch node;
a first current mirror circuit that is coupled to the first mirror node and a first output node, wherein
the first current mirror circuit is configured to:
receive a first switch current at the first mirror node; and
reflect the first switch current to provide a first reflected current at the first output node according to a pre-determined ratio that is greater than one-to-one;
a second current source circuit that is coupled to the first output node;
a second switch circuit that is coupled to a second switch node, a second mirror node, and a control node, wherein
the second switch circuit is configured to:
receive the control voltage;
if the control voltage exceeds a high threshold
isolate the second mirror node from the second switch node; else
reduce a resistance between the second mirror node and the second switch node; and
a third current source circuit that is coupled to the second switch node;
a second current mirror circuit that is coupled to the second mirror node and a second output node, wherein
the second current mirror circuit is configured to:
receive a second switch current at the second mirror node; and
reflect the second switch current to provide a second reflected current at the second output node according to another pre-determined ratio that is greater than one-to-one; and
a fourth current source circuit that is coupled to the second output node.

18. The tri-level decoder circuit as in claim 17, further comprising:
a capacitor that is coupled between that first mirror node and the first output node; and
another capacitor that is coupled between that second mirror node and the second output node.

19. The tri-level decoder circuit as in claim 17, further comprising:
- a modified wilson current mirror circuit that is coupled to a first bias node and a second bias node,
- wherein the first current source circuit comprises a first current source transistor having a gate that is coupled to the first bias node,
- the second current circuit comprises a second current source transistor having a gate that is coupled to the first bias node,
- the third current source circuit comprises a third current source transistor having a gate that is coupled to the second bias node, and
- the fourth current circuit comprises a fourth current source transistor having a gate that is coupled to the second bias node.

20. A tri-level decoder circuit, comprising:
- means for comparing a voltage to a first threshold;
- means for comparing the voltage to a second threshold;
- means for providing a current in response to the first threshold comparison;
- means for reflecting the current to provide another current; and
- means for actively driving the voltage if an input node does not receive a driving input signal.

21. A tri-level decoder circuit, comprising:
- a first decoder circuit that is coupled to an input node and a first output node, wherein the first decoder circuit includes:
  - a first switch circuit that is coupled between the input node and a first switch node;
  - a first current mirror circuit, including:
    - a first n-type transistor having at least a gate, a drain, and a source, wherein the drain of the first transistor is coupled to first switch node, and wherein the gate of the first transistor is coupled to the drain of the first transistor; and
    - a second n-type transistor having at least a gate, a drain, and a source, wherein the gate of the second transistor is coupled to the gate of the first transistor, and wherein the drain of the second transistor is coupled to the first output node; and
- a second decoder circuit that is coupled to the input node and a second output node, wherein the second decoder circuit includes a second current mirror circuit, and wherein the second current mirror circuit includes a plurality of p-type transistors.

22. A tri-level decoder circuit, comprising:
- a first decoder circuit that is coupled to an input node and a first output node, wherein the first decoder circuit includes:
  - a first switch circuit that is coupled between the input node and a first switch node, wherein the first switch circuit is not part of a differential pair; and
  - a first current mirror circuit having at least: an input that is coupled to the first switch node, and an output that is coupled to the first output node; and
- a second decoder circuit that is coupled to the input node and a second output node.

23. A tri-level decoder circuit, comprising:
- a first decoder circuit that is coupled to an input node and a first output node, wherein the first decoder circuit includes:
  - a first switch circuit that is coupled between the input node and a first switch node; and
  - a first current mirror circuit having at least: an input that is coupled to the first switch node, and an output that is coupled to the first output node;
- a second decoder circuit that is coupled to the input node and a second output node; and
- a non-linear filter circuit that is coupled between the first switch node and the first output node.

* * * * *

UNITED STATES PATENT AND TRADEMARK OFFICE
CERTIFICATE OF CORRECTION

| | | |
|---|---|---|
| PATENT NO. | : 7,088,139 B1 | Page 1 of 1 |
| APPLICATION NO. | : 10/750375 | |
| DATED | : August 8, 2006 | |
| INVENTOR(S) | : Eric David Blom | |

It is certified that error appears in the above-identified patent and that said Letters Patent is hereby corrected as shown below:

In the Specification:

First Page Col. 2 (U.S. Patent Documents), Line 2, After "6,472,907" delete "B1" and insert -- B2 --.

First Page Col. 2 (U.S. Patent Documents), Line 3, After "6,700,416" delete "B1" and insert -- B2 --.

First Page Col. 2 (U.S. Patent Documents) Line 4, After "6,864,725" delete "B1" and insert -- B2 --.

Column 2, Line 62, After "current" delete "11" and insert -- I1 --.

Signed and Sealed this

Nineteenth Day of December, 2006

JON W. DUDAS
*Director of the United States Patent and Trademark Office*